US008796044B2

(12) United States Patent
Beecher et al.

(10) Patent No.: US 8,796,044 B2
(45) Date of Patent: Aug. 5, 2014

(54) FERROELECTRIC RANDOM ACCESS MEMORY WITH OPTIMIZED HARDMASK

(71) Applicant: International Business Machines Corporation, Armonk, NY (US)

(72) Inventors: James E. Beecher, Milton, VT (US); William J. Murphy, North Ferrisburgh, VT (US); James S. Nakos, Essex Junction, VT (US); Bruce W. Porth, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/628,715

(22) Filed: Sep. 27, 2012

(65) Prior Publication Data

US 2014/0084352 A1 Mar. 27, 2014

(51) Int. Cl.
*H01L 21/00* (2006.01)
*H01L 21/8242* (2006.01)
*H01L 21/20* (2006.01)
*H01L 21/02* (2006.01)
*H01L 27/108* (2006.01)
*H01L 29/76* (2006.01)

(52) U.S. Cl.
USPC ............ 438/3; 438/240; 438/118; 438/253; 438/396; 257/295; 257/296; 257/288; 257/301

(58) Field of Classification Search
CPC ............ H01L 27/11507; H01L 28/55; H01L 21/32136; H01L 21/32139; H01L 27/11502; H01L 28/57; H01L 28/60; H01L 28/65; H01L 28/75
USPC ............ 438/3, 240, 118, 253, 396; 257/295, 257/296, 288, 301
See application file for complete search history.

(56) References Cited

U.S. PATENT DOCUMENTS

| 6,475,860 | B2 * | 11/2002 | Kwon et al. | 438/253 |
|---|---|---|---|---|
| 6,555,431 | B1 * | 4/2003 | Xing et al. | 438/253 |
| 6,600,183 | B1 | 7/2003 | Visokay et al. | |
| 6,924,156 | B2 * | 8/2005 | Zhuang et al. | 438/3 |
| 6,963,097 | B2 | 11/2005 | Kweon | |
| 7,015,049 | B2 | 3/2006 | Egger et al. | |
| 7,045,837 | B2 * | 5/2006 | Egger et al. | 257/295 |
| 7,390,679 | B2 | 6/2008 | Miyaji | |
| 7,750,383 | B2 | 7/2010 | Kanaya | |
| 2006/0014307 | A1 * | 1/2006 | Kweon | 438/3 |
| 2006/0043446 | A1 * | 3/2006 | Fukada | 257/295 |
| 2007/0218568 | A1 * | 9/2007 | Miyaji | 438/3 |
| 2008/0277704 | A1 * | 11/2008 | Kanaya | 257/295 |
| 2009/0149030 | A1 * | 6/2009 | Chang | 438/752 |
| 2010/0033469 | A1 * | 2/2010 | Nathan et al. | 345/211 |
| 2010/0176427 | A1 * | 7/2010 | Celii | 257/295 |
| 2010/0270601 | A1 * | 10/2010 | Udayakumar et al. | 257/295 |
| 2010/0320519 | A1 * | 12/2010 | Nagai | 257/295 |
| 2011/0195548 | A1 * | 8/2011 | Yeh et al. | 438/199 |

* cited by examiner

*Primary Examiner* — Shaun Campbell
*Assistant Examiner* — Thai T Vuong
(74) *Attorney, Agent, or Firm* — Wood, Herron & Evans LLP; Anthony J. Canale

(57) ABSTRACT

Device structures, fabrication methods, and design structures for a capacitor of a memory cell of ferroelectric random access memory device. The capacitor may include a first electrode comprised of a first conductor, a ferroelectric layer on the first electrode, a second electrode on the ferroelectric layer, and a cap layer on an upper surface of the second electrode. The second electrode may be comprised of a second conductor, and the cap layer may have a composition that is free of titanium. The second electrode may be formed by etching a layer of a material formed on a layer of the second conductor to define a hardmask and then modifying the remaining portion of that material in the hardmask to have a comparatively less etch rate, when exposed to a chlorine-based reactive ion etch chemistry, than when initially formed.

10 Claims, 7 Drawing Sheets

FERROELECTRIC RANDOM ACCESS MEMORY WITH OPTIMIZED HARDMASK

BACKGROUND

The present invention relates to semiconductor devices and device fabrication and, more specifically, to device structures, fabrication methods, and design structures for a capacitor of a memory cell of a ferroelectric random access memory device.

Memory devices are utilized for data storage. Generally, a memory device includes a plurality of memory cells that can be placed in multiple states for digital data storage. One type of non-volatile memory device is a ferroelectric random access memory (FRAM), also known as ferroelectric random access memory (FeRAM). Even if not constantly supplied with electric power, a FRAM device preserves the stored data and, as such, is suitable for long-term data storage. In comparison with other types of memory devices, a FRAM device offers high-speed access, reduced power consumption, and is resistant to shock damage. Accordingly, a FRAM device may be used as a primary storage device for various electronic devices and equipment.

A FRAM device integrates a capacitor comprised of a layer of a ferroelectric material and a pass transistor in each memory cell. The capacitor of each memory cell stores logical data in the form of binary digits each of which has a value of "1" or "0" depending on the polarization state of the ferroelectric material. When a voltage is applied across the capacitor, a ferroelectric material of the capacitor is polarized according to the direction of an electric field. The applied voltage must exceed a threshold voltage capable of causing a change in the polarization state in the particular ferroelectric material. To read data stored in the memory cell, a voltage is applied between both electrodes of the capacitor to cause a potential difference across the ferroelectric material and thereby excite charge transport on a bit line. The state of the logical data stored in the memory cell is sensed as a change in the bit line current.

Device structures, fabrication methods, and design structures are needed for a capacitor of a memory cell of a FRAM device.

SUMMARY

According to one embodiment of the present invention, a device structure includes a first electrode comprised of a first conductor, a ferroelectric layer on the first electrode, a second electrode on the ferroelectric layer, and a cap layer on an upper surface of the second electrode. The second electrode is comprised of a second conductor, and the cap layer has a composition that is free of titanium.

According to another embodiment of the present invention, a fabrication method includes forming a first layer comprised of a conductor, forming a second layer on the first layer, patterning the second layer resulting in a portion of the second layer remaining upon the first layer, and then modifying a material of the portion of the second layer so that the material has a second etch rate less than the first etch rate when exposed to a chlorine-based reactive ion etch chemistry. The method further includes, after the material of the portion of the second layer is modified, etching the first layer using the chlorine-based reactive ion etch chemistry and the modified material in the portion of the second layer as a hardmask.

According to yet another embodiment of the present invention, a design structure is provided that is readable by a machine used in design, manufacture, or simulation of an integrated circuit. The design structure includes a first electrode comprised of a first conductor, a ferroelectric layer on the first electrode, a second electrode on the ferroelectric layer, and a cap layer on an upper surface of the second electrode. The second electrode is comprised of a second conductor, and the cap layer has a composition that is free of titanium. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
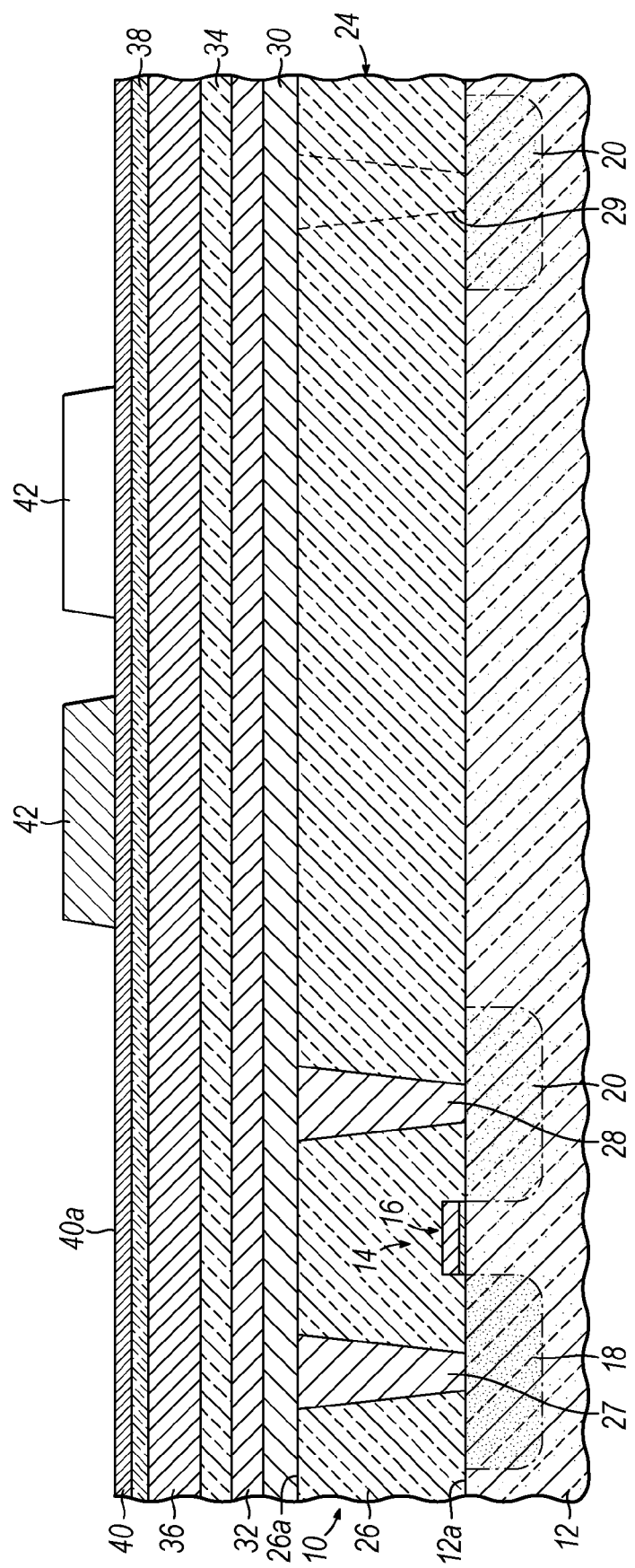
FIG. 1 is a cross-sectional view of a portion of a substrate at an initial fabrication stage of a processing method for forming a ferroelectric random access memory device in accordance with an embodiment of the invention.

With reference to FIG. 1 and in accordance with an embodiment of the invention, a local interconnect level 24 of a multi-level, back-end-of-line (BEOL) interconnect structure, generally indicated by reference numeral 10, is formed on a substrate 12. The substrate 12 may be comprised of a semiconductor material that a person having ordinary skill in the art would recognize as suitable for forming an integrated circuit. For example, the substrate 12 may be comprised of a monocrystalline silicon-containing material, such as a bulk single crystal silicon wafer, an epitaxial silicon layer grown on a bulk substrate, or a silicon-on-insulator (SOI) layer of a SOI wafer. The substrate 12 may be lightly doped with an impurity to alter the electrical properties of the constituent semiconductor material. For example, the semiconductor material of the substrate 12 may be lightly doped with a concentration of a p-type impurity species (e.g., boron or indium).

An integrated circuit, which includes the representative active device 14 among its active devices, is fabricated by front-end-of-line (FEOL) processes in and on the substrate 12. The active device 14 is illustrated as a field-effect transistor having a gate stack 16 residing on an upper surface 12a of the substrate 12, a drain region 18, and a source region 20 in the semiconductor material of the substrate 12. Device designs for field-effect transistors and the details of FEOL processing are familiar to a person having ordinary skill in the art. The active device 14 may comprise the pass transistor for a memory cell of a ferroelectric random access memory (FRAM) device.

Local interconnect level 24 includes a dielectric layer 26 and a plurality of contacts 27, 28, 29 residing in contact holes extending vertically through the dielectric layer 26. Dielectric layer 26 may be comprised of an insulating material, such as silicon dioxide ($SiO_2$), phosphosilicate glass (PSG), or borophosphosilicate glass (BPSG), deposited on the upper surface 12a of substrate 12. Contacts 27, 28, 29 may be comprised of a conductive material, such as tungsten, deposited in openings defined in the dielectric layer 26 by photolithography and etching processes. Contact 27 is aligned with the drain region 18 of active device 14 and contact 28, 29 are aligned with the source region 20 of active device 14.

Layers 30, 32, 34, 36, 38, 40 are serially formed to define a layer stack on an upper surface 26a of dielectric layer 26. The layers 30, 32, 34, 36, 38, 40 may be comprised of different materials that can be selectively etched relative to the dielectric layer 26 and/or relative to each other. As used herein, the term "selective" in reference to a material removal process (e.g., etching) denotes that the material removal rate for the targeted material is higher than the removal rate for at least another material exposed to the material removal process.

Layer 40 may be comprised of a thin film of a material that is easier to etch (i.e., has a higher etch rate) in the deposited native state in comparison with a post-deposition state in which the constituent material has been modified by, for example, oxidation. In other words, the etch rate of the material in its modified state is comparatively less than the etch rate of the material in its native state. The ability to easily etch the constituent material of layer 40 followed by a modification to change its etching characteristics may be utilized to form a hardmask that is comparatively difficult to etch (i.e., has a comparatively lower etch rate). In one embodiment, the material of layer 40 may be in a metallic state, which can be modified to form a non-metallic state that is more difficult to etch than the metallic state. In one embodiment, layer 40 may be comprised of titanium (Ti), which can be oxidized to form a titanium dioxide ($TiO_2$) that is more difficult to etch than Ti.

Layer 38 may be comprised of a thin film of an electrical insulator, such as aluminum oxide ($Al_2O_3$), and may be formed using atomic layer deposition (ALD) or physical vapor deposition (PVD). ALD is a deposition technique in which deposition of each atomic layer of the electrical insulator, or a fraction thereof, is controlled by alternating and sequential introduction of appropriate gas phase precursors that react in a self-limiting manner to incrementally form or build layer 38. One set of gas phase precursors that may be used to form $Al_2O_3$ by an ALD process is water vapor and trimethylaluminum ($Al(CH_3)_3$ or TMA). Layer 38 may be free of titanium as an element in its composition. The material properties of layer 38 may be selected such that the material of layer 38 does not modify the material properties of layer 36 and, in particular, such that the material of layer 38 does not cause reduction of the material of layer 36 or a component of the material of layer 36 under heating.

Layer 36 may be comprised of a thin film of a metal selected from the platinum group metals of the Periodic Table, a thin film of a metal oxide containing a metal from the platinum group metals, or one or more thin films containing combinations of these materials. In various embodiments, layer 36 may comprise iridium (Ir), ruthenium (Ru), rhodium (Rh), rhenium (Re), platinum (Pt), palladium (Pd), conductive oxides of the preceding metals such as iridium oxide, ruthenium oxide, palladium oxide, rhodium oxide, rhenium oxide, and platinum oxide, or any combination of these metals and metal oxides deposited using PVD, chemical vapor deposition (CVD), and/or ALD.

In one embodiment, layer 36 may comprise iridium oxide ($IrO_x$) or a bilayer of iridium oxide and iridium. Iridium oxide and iridium are characterized by stable electrical and chemical properties, even at high temperatures in an oxygen ($O_2$) ambient. To form the layer 36 from iridium oxide, a thin film of metallic iridium can be deposited using PVD or CVD and then oxidized. Alternatively, iridium oxide may be directly formed using reactive sputtering in an oxygen ambient or using CVD.

Layer 34 may be comprised of a thin film of a material exhibiting ferroelectricity, which is a property of a certain class of materials exhibiting a spontaneous electric polarization that can be reversed by the application of an external electric field. Because of the existence of this property, information can be stored in a nonvolatile manner by polarizing the ferroelectric material of layer 34. The ferroelectric material may be an electrical insulator so that layer 34 can operate as a capacitor dielectric in a ferroelectric capacitor. In one embodiment, layer 34 may be a ferroelectric film comprised of a titanate such as $Pb(Zr,Ti)O_3$ (PZT) deposited by metalorganic chemical vapor deposition (MOCVD) using suitable organic Pb, Zr, and Ti precursors. Alternatively, layer 34 may be comprised of a different titanate, such as barium strontium titanate $Ba_xSr_{1-x}TiO_3$ (BST), or a tantalate, such as strontium bismuth tantalate.

Layer 32 may be comprised of a thin film of a conductor, such as any of the same materials comprising layer 36. In one embodiment, the material comprising layer 32 differs from the material comprising layer 36. In another embodiment, the constituent material of layer 32 may be comprised of Pt. An adhesion layer (not shown), such as titanium oxide ($TiO_2$), $Al_2O_3$, or layer combinations of $TiO_2$ and $Al_2O_3$, can be used in conjunction with layer 32 can use adhesion layers. Layer 30 may be comprised of an electrical insulator, such as $SiO_2$ deposited by ALD, plasma enhanced CVD (PECVD), or CVD.

A photoresist layer 42 may be formed on an upper surface 40a of layer 40 and may function as an etch mask during a subsequent etch. During a photolithography process, the photoresist layer 42 may be applied by a spin coating process, pre-baked, exposed to radiation projected through a photomask, baked after exposure, and developed to form an etch mask that includes residual intact regions coinciding with the intended spatial locations of sections of an upper electrode.

Figure 2:
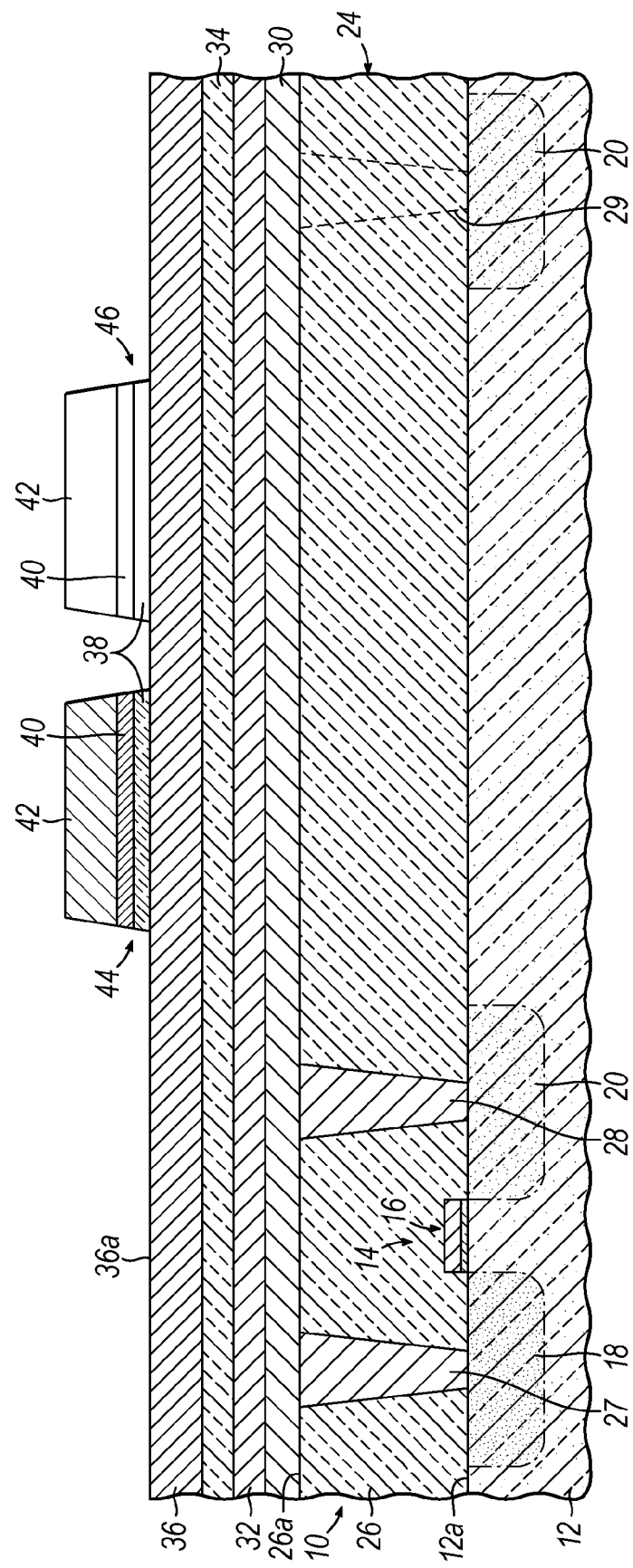
FIGS. 2-6 are cross-sectional views at successive fabrication stages of the processing method subsequent to FIG. 1.

With reference to FIG. 2 in which like reference numerals refer to like features in FIG. 1 and at a subsequent fabrication stage, layers 38, 40 are patterned by etching layers 38, 40 (FIG. 1) with the photoresist layer 42 present. After patterning, regions 44, 46 of layers 38, 40 remain. The etching process forming regions 44, 46 may comprise a dry etch, such as reactive-ion etching (RIE) using an appropriate etch chemistry. The etching process, which may be conducted in a single etching step or multiple etching steps, may rely on etch selectivity to stop on a top surface 36a of layer 36. In a representative embodiment, the etch chemistry of the plasma for removing the exposed portions of the layers 38, 40 during patterning is a chlorine-based chemistry, such as chlorine ($Cl_2$), and may include an additive, such as argon (Ar) to form a $Cl_2$/Ar mixed-gas plasma. The etching process may form additional regions of layers 38, 40 similar or identical to regions 44, 46. These additional regions are either aligned with region 44 or aligned with region 46 to define spaced-apart regions distributed in parallel lines across the upper surface 40a of layer 40.

Figure 3:
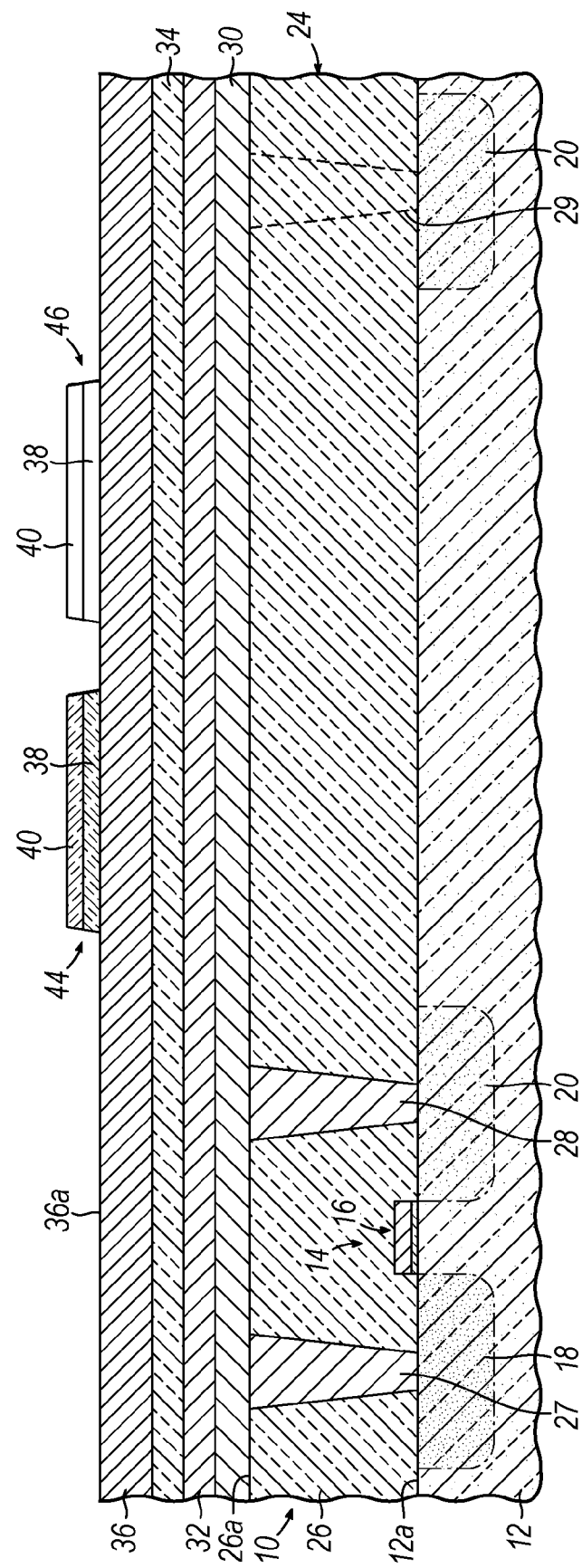

With reference to FIG. 3 in which like reference numerals refer to like features in FIG. 2 and at a subsequent fabrication stage, the photoresist layer 42 is removed by, for example, solvent stripping, followed by surface cleaning. Layer 40 in each of the regions 44, 46 is exposed following the removal of photoresist layer 42. The material comprising layer 40 is converted from an as-deposited state in which the material is easily etched to a different state in which the material comprising layer 40 is difficult to etch and capable of serving as a hardmask for an etching process. In one embodiment, the material comprising layer 40 in regions 44, 46 may be converted from an elemental or alloy form, such as an elemental metal or metal alloy, to a compound, such as a metal oxide. In a representative embodiment, the material of layer 40 may be titanium (Ti) that is converted or modified by an oxidization process to form titanium dioxide ($TiO_2$), which is comparatively more difficult to etch than Ti under the same nominal etch chemistry and conditions. The oxidation process may be a rapid thermal oxidation performed in an oxygen ambient inside a rapid thermal processing system.

In its modified condition, the material of layer 40 has a lower etch rate than in its deposited condition and, preferably, an etch rate that is an order of magnitude lower than in its deposited condition. The material of layer 40, which does not have direct contact with the material of layer 36, is removed during the etching process used to subsequently pattern layer 36. The intervening positioning of layer 38 and the use of the modified material of layer 40 as a hardmask eliminates the conventional use of a titanium-containing material, such as titanium nitride (TiN) or titanium aluminum nitride (TiAlN), as a hardmask in direct contact with layer 36 when forming the top electrode from layer 36. In particular, such conventional materials are prone to blistering in subsequent elevated temperature processes, such as resist strips and $O_2$ anneals. In addition, the material of layer 36 is at a reduced risk of undesired modification (e.g., reduction) under heating because of the absence of direct contact a titanium-containing material.

Figure 4:
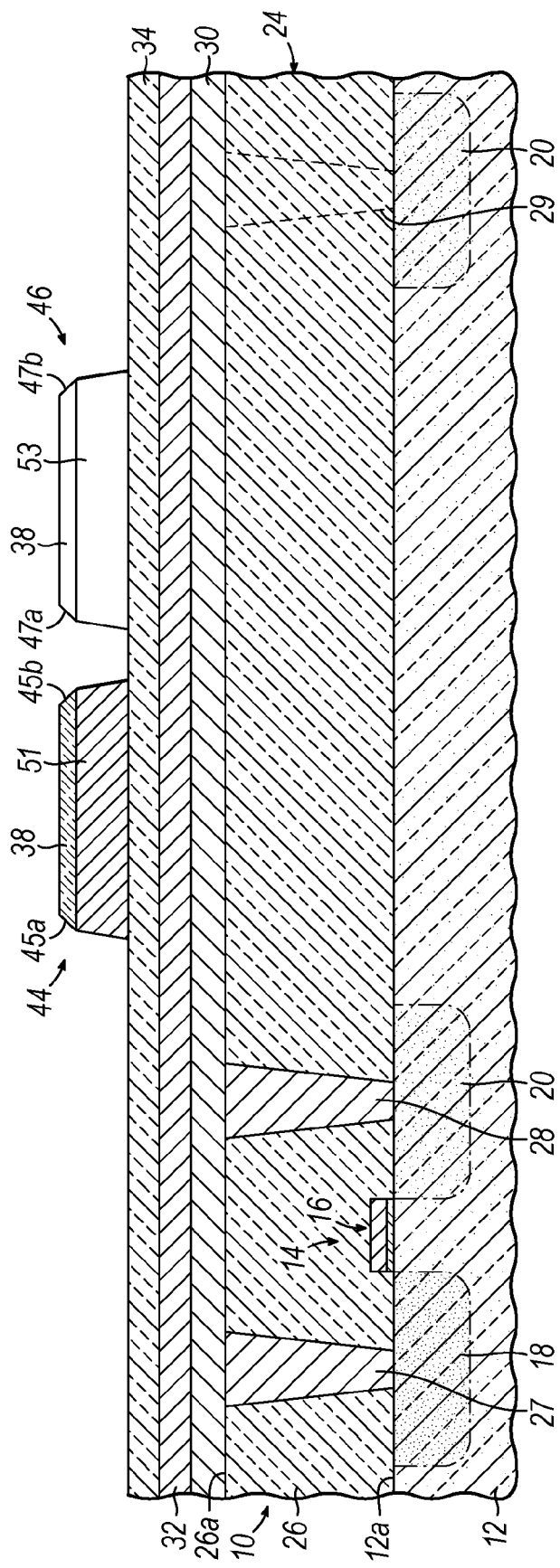

With reference to FIG. 4 in which like reference numerals refer to like features in FIG. 3 and at a subsequent fabrication stage, layer 36 is patterned with an etching process that relies on layer 40 in the regions 44, 46 as a hardmask. Layer 36 may be etched with RIE using an appropriate etch chemistry. In a representative embodiment, the etch chemistry of the plasma for removing the exposed portions of the layer 36 during patterning is a chlorine-based chemistry, such as chlorine ($Cl_2$), in which chlorine supplies the reactive species and may include one or more additives, such as Ar and oxygen ($O_2$) to form a $Cl_2/Ar/O_2$ mixed-gas plasma. The etching process may remove all of layer 40 in regions 44, 46 and, after layer 40 is removed, leave at least a partial thickness of layer 38 in regions 44, 46 as respective cap layers. The sidewalls 45a, 45b of layer 38 in region 44 and the sidewalls 47a, 47b of layer 38 in region 46 are free of re-deposited material (i.e., rail layers) originating from sputtered and volatized material liberated when layer 36 is etched. The etching process is performed without the use of a patterned photoresist layer.

Figure 5:
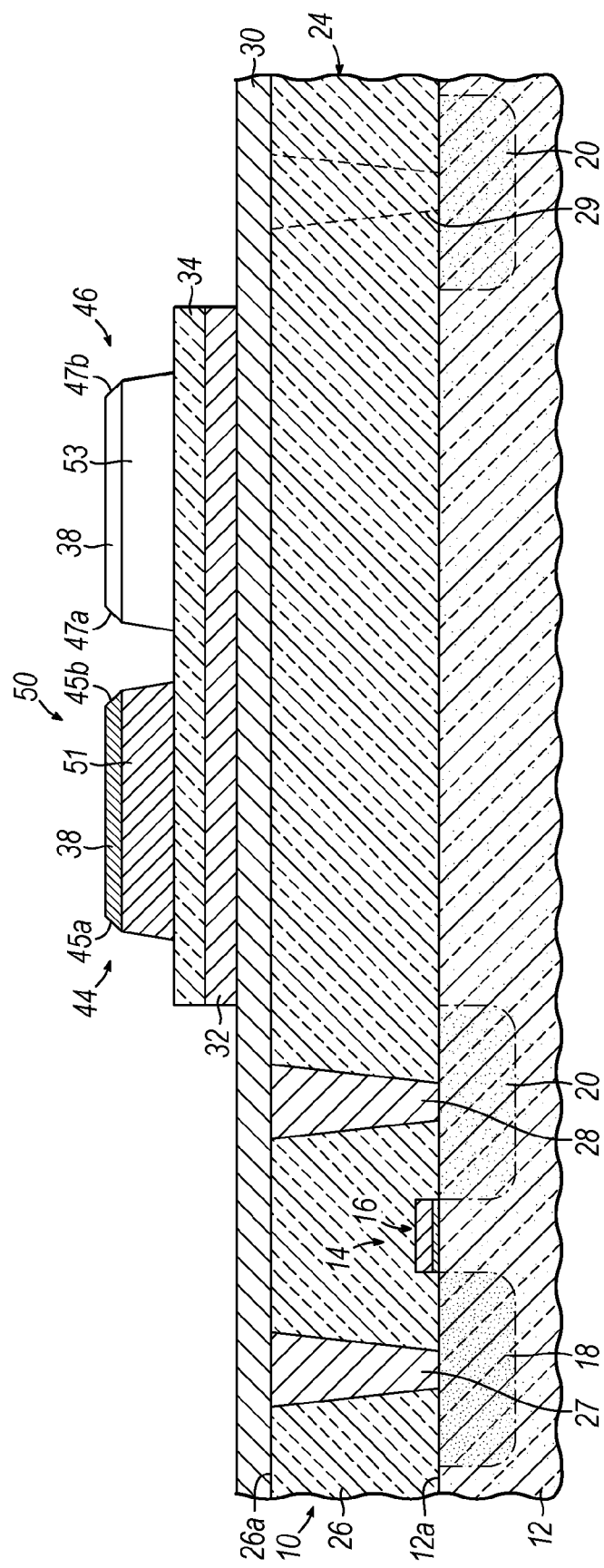

With reference to FIG. 5 in which like reference numerals refer to like features in FIG. 4 and at a subsequent fabrication stage, layers 32, 34 are patterned by forming a photoresist mask with photolithography and then etching to complete a capacitor structure 50 for the memory cell of the FRAM. The remaining conductor of layer 32 defines a bottom electrode of the capacitor structure 50, the remaining ferroelectric material of layer 34 defines a capacitor dielectric of the capacitor structure 50, and the remaining conductor of layer 36 defines a top electrode of the capacitor structure 50. The layer 36 of the top electrode is segmented into a plurality of sections 51, 53 at the locations of the regions 44, 46 of layer 38. Additional sections of the top electrode are aligned with section 51 or aligned with section 53 to define spaced-apart sections distributed in parallel lines across the top surface 40a of layer 40.

The capacitor structure 50 is configured to store logical data in the form of binary digits each of which has a value of "1" or "0" depending on the polarization state of the ferroelectric material of layer 34. When a voltage is applied to layers 32, 36 serving as lower and upper electrodes to establish an electric field across the capacitor structure 50, the ferroelectric material of layer 34 is polarized according to the direction of the electric field. The applied voltage must exceed a threshold voltage capable of causing a change in the polarization state in the ferroelectric material of layer 34. The active device 14 is used to control the application of the voltage to layers 32, 36.

The material of layer 38 covers the conductor of layer 36 as a cap layer and, during the process step etching layer 36, has an intervening positioning between layer 36 and layer 40. Preferably, a bottom surface of the layer 38 comprising the cap layer is in direct contact with the top surface 36a of layer 36. The material of layer 38 is selected such that the material does not react with the conductor of layer 36 during heating. Layer 38 may supply a fully oxidized surface for the top electrode that does not blister in subsequent processes, such as resist strips and $O_2$ anneals. In particular, the cap layer formed by layer 38 is free of titanium.

Figure 6:
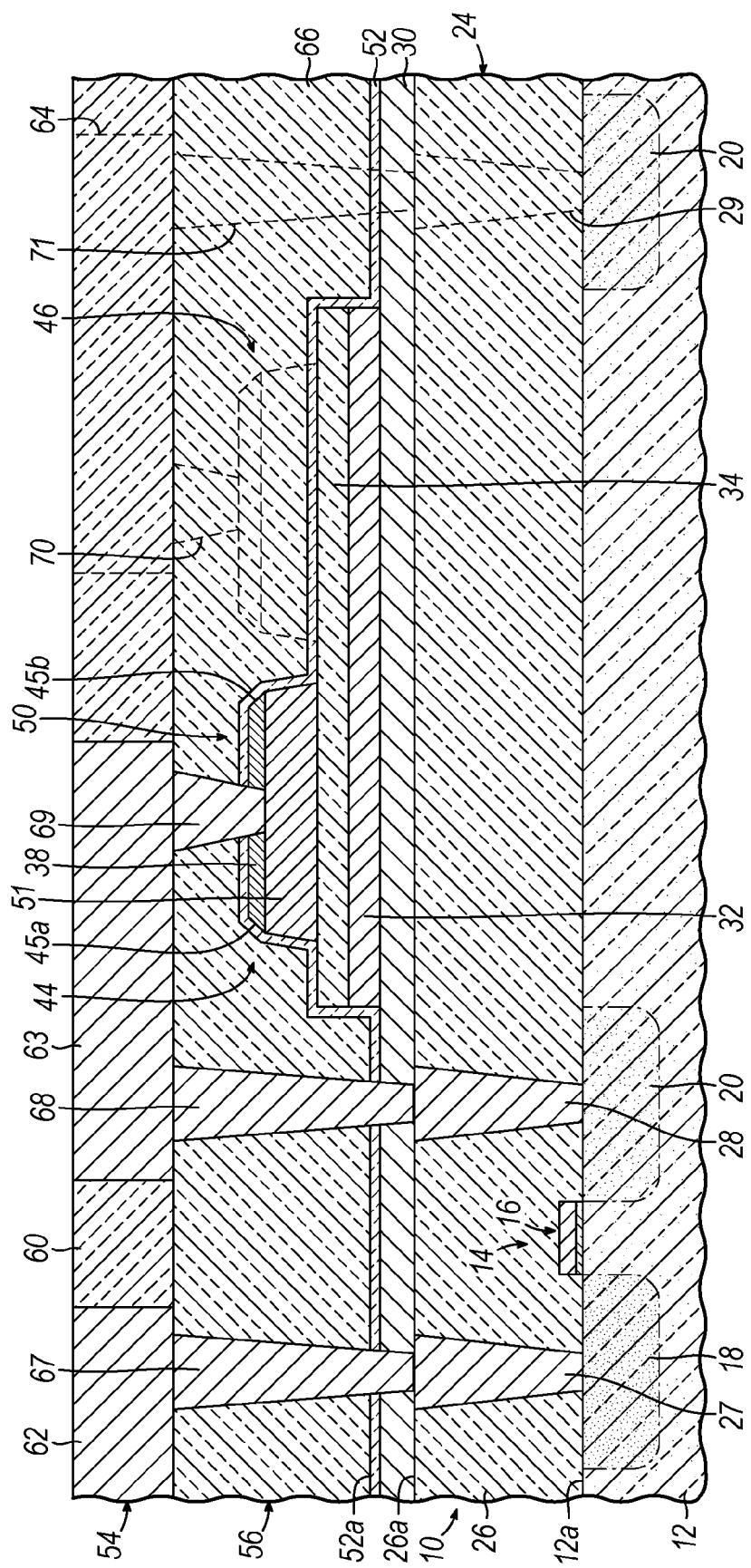

With reference to FIG. 6 in which like reference numerals refer to like features in FIG. 5 and at a subsequent fabrication stage, a conformal encapsulation layer 52 is formed across the capacitor structure 50. Encapsulation layer 52 may be comprised of an electrical insulator, such as alumina ($Al_2O_3$) formed by ALD. The elimination of blistering, as discussed above, eliminates blistering that would otherwise operate to compromise the integrity of the encapsulation layer 52.

Standard BEOL processing follows the fabrication of the capacitor structure 50 to form the remainder of the BEOL interconnect structure 10 for interconnecting the active devices 14 of the integrated circuit and may provide circuit-to-circuit connections, or may establish contacts with input and output terminals. The wiring and via levels of the BEOL interconnect structure 10, including wiring level 54 and via level 56, may be fabricated by damascene processes. In particular, the wiring level 54 and via level 56 may couple the active device 14 with the capacitor structure 50 to form the memory cell of the FRAM device. The BEOL interconnect structure 10 may include additional wiring levels and via levels (not shown) above wiring level 54.

Wiring level 54 includes a dielectric layer 60 and a plurality of wires 62, 63, 64 residing in trenches defined in the dielectric layer 60. Via level 56 includes a dielectric layer 66 and via plugs 67, 68, 69, 70, 71 residing in vias extending vertically through the dielectric layer 66. An additional dielectric layer (not shown) may be present between the dielectric layers 60, 66 and may function as an etch stop.

In one embodiment, the wiring level 54 and via level 56 may be formed by a dual damascene process in which the dielectric layers 60, 66 are deposited that cover the capacitor structure 50 and upper surface 52a of the encapsulation layer 52, vias and trenches are respectively etched in the dielectric layers 60, 66, and the vias and trenches are filled with a conductor (e.g., copper, aluminum, or a copper-aluminum alloy) using a single blanket deposition followed by planarization to define wires 62, 63, 64 in dielectric layer 60. Planarization may comprise chemical mechanical polishing (CMP), which is a material removal process using both chemical reactions and mechanical erosion to remove material and planarize a surface. Planarization also removes topography caused by the capacitor structure 50. The conductor filling the vias in dielectric layer 66 define the via plugs 67, 68, 69, 70, 71. The damascene process may be iterated to form additional wiring and via levels. Typically, conductive features in upper wiring levels of the BEOL interconnect structure 10 may be thicker and wider, and may have a greater pitch, than features found in lower wiring levels.

The wires 62, 63, 64 in dielectric layer 60 and the via plugs 67, 68, 69, 70, 71 in dielectric layer 66 may be comprised of a conductive material, such as copper (Cu), aluminum (Al), alloys (e.g., AlCu), and other similar metals. Before the conductive material is deposited, a liner layer (not shown) may be applied inside the trenches and vias. The liner layer may be composed of a conductor such as tantalum (Ta), tantalum nitride (TaN), titanium (Ti), titanium nitride (TiN), bilayers of these conductors, or another suitable conductor with material properties appropriate to operate as a diffusion barrier between the conductive and insulator materials and/or as an adhesion promoter.

Dielectric layers 60, 66 may comprise one or more organic or inorganic insulating materials or a layered combination of two or more organic and inorganic insulating materials deposited by sputtering, spin-on application, CVD, PECVD, etc. Candidate inorganic insulating materials may include, but are not limited to, silicon dioxide, fluorine-doped silicon glass (FSG), and combinations of these dielectric materials. The dielectric layers 60, 66 may be comprised of one or more insulating materials with a relative permittivity or dielectric constant (i.e., low-k) smaller than the dielectric constant of silicon dioxide. Candidate low-k insulating materials include, but are not limited to, porous and nonporous spin-on organic low-k dielectrics, such as spin-on aromatic thermoset polymer resins, and porous and nonporous inorganic low-k dielectrics, such as organosilicate glasses, hydrogen-enriched silicon oxycarbide (SiCOH), and carbon-doped oxides.

Wire 62 may be coupled by via plug 67 with contact 27 of the local interconnect level 24 and used to supply voltage to the drain region 18 of active device 14. Wires 63, 64 may be coupled by via plugs 68, 71 with contacts 28, 29 of the local interconnect level 24. Wires 63, 64 may be coupled by via plugs 69, 70 with the top electrode constituted by layer 36 so that the top electrode constituted by layer 36 is coupled with the source region 20 of active device 14. A resulting device structure includes active device 14 and the capacitor structure 50, and may be configured to operate as a memory cell in a FRAM.

Figure 7:
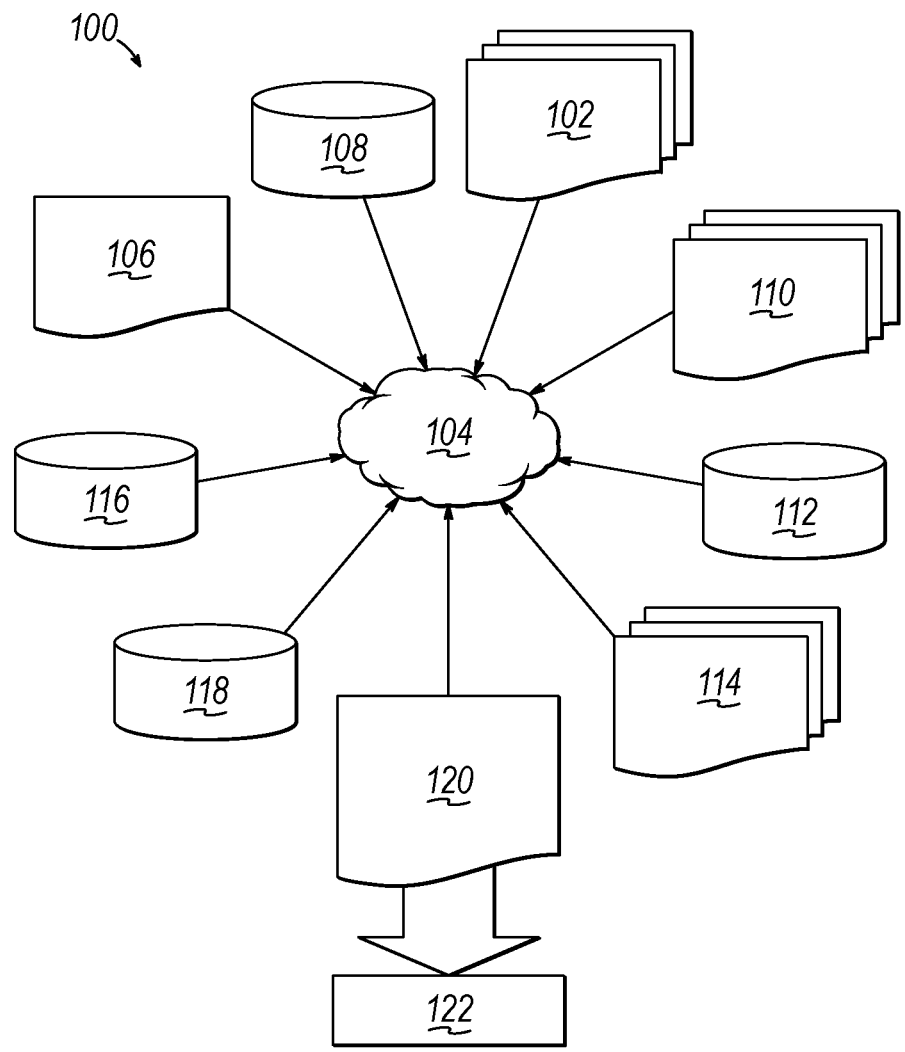
FIG. 7 is a flow diagram of a design process used in semiconductor design, manufacture, and/or test.

FIG. 7 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 6. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 6. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 6. In one embodiment, design structure 120 may comprise a compiled, executable HDL simulation model that functionally simulates the devices shown in FIG. 6.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 6. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A fabrication method comprising:
   forming a first layer comprised of a conductor;
   forming a second layer on the first layer, the second layer comprised of a material having a first etch rate;
   patterning the second layer resulting in a portion of the second layer remaining upon the first layer;
   modifying the material of the portion of the second layer so that the material has a second etch rate less than the first etch rate when exposed to a chlorine-based reactive ion etch chemistry; and
   after the material of the portion of the second layer is modified, etching the first layer using the chlorine-based reactive ion etch chemistry and the modified material in the portion of the second layer as a hardmask.

2. The fabrication method of claim 1 wherein patterning the second layer comprises:
   applying a photoresist layer to an upper surface of the second layer; and
   after the photoresist layer is applied, etching the second layer to form the portion.

3. The fabrication method of claim 2 further comprising:
   removing the photoresist layer before the material of the portion of the second layer is modified.

4. The fabrication method of claim 3 wherein the material of the second layer is a metal when formed, and modifying the material of the portion of the second layer comprises:
   oxidizing the metal in the portion of the second layer to form a metal oxide.

5. The fabrication method of claim 1 wherein the material of the second layer is a metal when formed, and modifying the material of the portion of the second layer comprises:
   oxidizing the metal in the portion of the second layer to form a metal oxide.

6. The fabrication method of claim 1 wherein the first layer comprises a first electrode of a capacitor structure for a memory cell of a ferroelectric memory (FRAM), and further comprising:
   before the first layer is formed, forming a third layer comprised of a conductor on an electrical insulator layer;
   before the first layer is formed, forming a fourth layer comprised of a ferroelectric material on the third layer, wherein the third layer comprises a second electrode of the capacitor structure and the fourth layer comprises a capacitor dielectric of the capacitor structure.

7. The fabrication method of claim 6 further comprising:
coupling the second layer with a source of a transistor.

8. The fabrication method of claim 1 further comprising:
before the second layer is formed, forming a third layer comprised of an electrical insulator on the first layer so that the third layer is positioned between the first layer and the second layer.

9. The fabrication method of claim 8 further comprising:
after the second layer is etching, etching the third layer using the hardmask and the chlorine-based reactive ion etch chemistry.

10. The fabrication method of claim 1 wherein the first layer is etched in the absence of a photoresist layer.

* * * * *